US009501588B1

(12) United States Patent
Rowe et al.

(10) Patent No.: US 9,501,588 B1
(45) Date of Patent: Nov. 22, 2016

(54) GARDEN SIMULATION

(71) Applicant: Kenneth S. Rowe, Groveland, MA (US)

(72) Inventors: Kenneth S. Rowe, Groveland, MA (US); Chris Duhaime, Hooksett, NH (US); Ryan Capers, Merrimack, NH (US); Craig Henry, Wilmington, MA (US)

(73) Assignee: Kenneth S. Rowe, Groveland, MA (US)

( * ) Notice: Subject to any disclaimer, the term of this patent is extended or adjusted under 35 U.S.C. 154(b) by 542 days.

(21) Appl. No.: 14/065,403

(22) Filed: Oct. 28, 2013

(51) Int. Cl.
*G06F 17/50* (2006.01)
*G06Q 50/02* (2012.01)
*A01C 21/00* (2006.01)

(52) U.S. Cl.
CPC ........... *G06F 17/5009* (2013.01); *A01C 21/00* (2013.01); *G05B 2219/23445* (2013.01); *G06F 17/5004* (2013.01); *G06Q 50/02* (2013.01)

(58) Field of Classification Search
None
See application file for complete search history.

(56) References Cited

U.S. PATENT DOCUMENTS

| | | | |
|---|---|---|---|
| 2007/0255502 A1* | 11/2007 | Pruett | A01B 79/005 702/19 |
| 2010/0030578 A1 | 2/2010 | Siddique et al. | |
| 2010/0114535 A1* | 5/2010 | Dore | G06F 17/5004 703/1 |
| 2011/0054921 A1* | 3/2011 | Lynds | A01G 1/00 705/1.1 |
| 2012/0124687 A1* | 5/2012 | Wipff | A01H 5/12 800/260 |
| 2014/0012732 A1* | 1/2014 | Lindores | A01B 79/005 705/37 |
| 2014/0297242 A1* | 10/2014 | Sauder | A01C 21/005 703/6 |
| 2014/0330542 A1* | 11/2014 | Subramanian | G05B 17/02 703/1 |
| 2015/0112595 A1* | 4/2015 | Brehmer | A01B 79/005 702/3 |
| 2015/0347544 A1* | 12/2015 | Caraballoso | G06F 17/30572 707/723 |
| 2016/0057922 A1* | 3/2016 | Freiberg | G06F 17/5009 701/50 |

FOREIGN PATENT DOCUMENTS

WO 2013059468 A9 5/2014

OTHER PUBLICATIONS

Murphy, K., "Gardening by the Apps", NYTimes.com, Apr. 4, 2012.
Tarng, W. et al., "The Development of a Virtual Farm for Applications in Elementary Science Education" (Abstract and Introduction), International Journal of Distance Education Technologies (IJDET), vol. 10, Issue 2, Apr. 1, 2012.
Prusinkiewicz, P., "Modeling of Spatial Structure and Development of Plants", Scientia Horticulturae, vol. 74, pp. 113-149, Aug. 6, 2013.

* cited by examiner

*Primary Examiner* — Kibrom K Gebresilassie
(74) *Attorney, Agent, or Firm* — North Shore Patents, P.C.; Michele Liu Baillie

(57) ABSTRACT

A website is provided for facilitating the design of a garden. The website allows a user to design a garden on-line, and then provide a visual simulation of the appearance of the garden through a time sequence spanning multiple growing seasons. The user designs the garden by selecting plants through an interactive user interface and positioning each selected plant onto an orthogonal-oriented "design plot". The growths of the plants in the garden are then simulated on a perspective-oriented "simulation plot". The simulation simultaneously displays images of each plant in the garden through different growth periods, which may include both blooming and non-blooming times. Through the simulation, the user may see what his or her garden would look like through the seasons prior to actual planting. The user may modify the garden design and rerun the simulation multiple times.

12 Claims, 18 Drawing Sheets

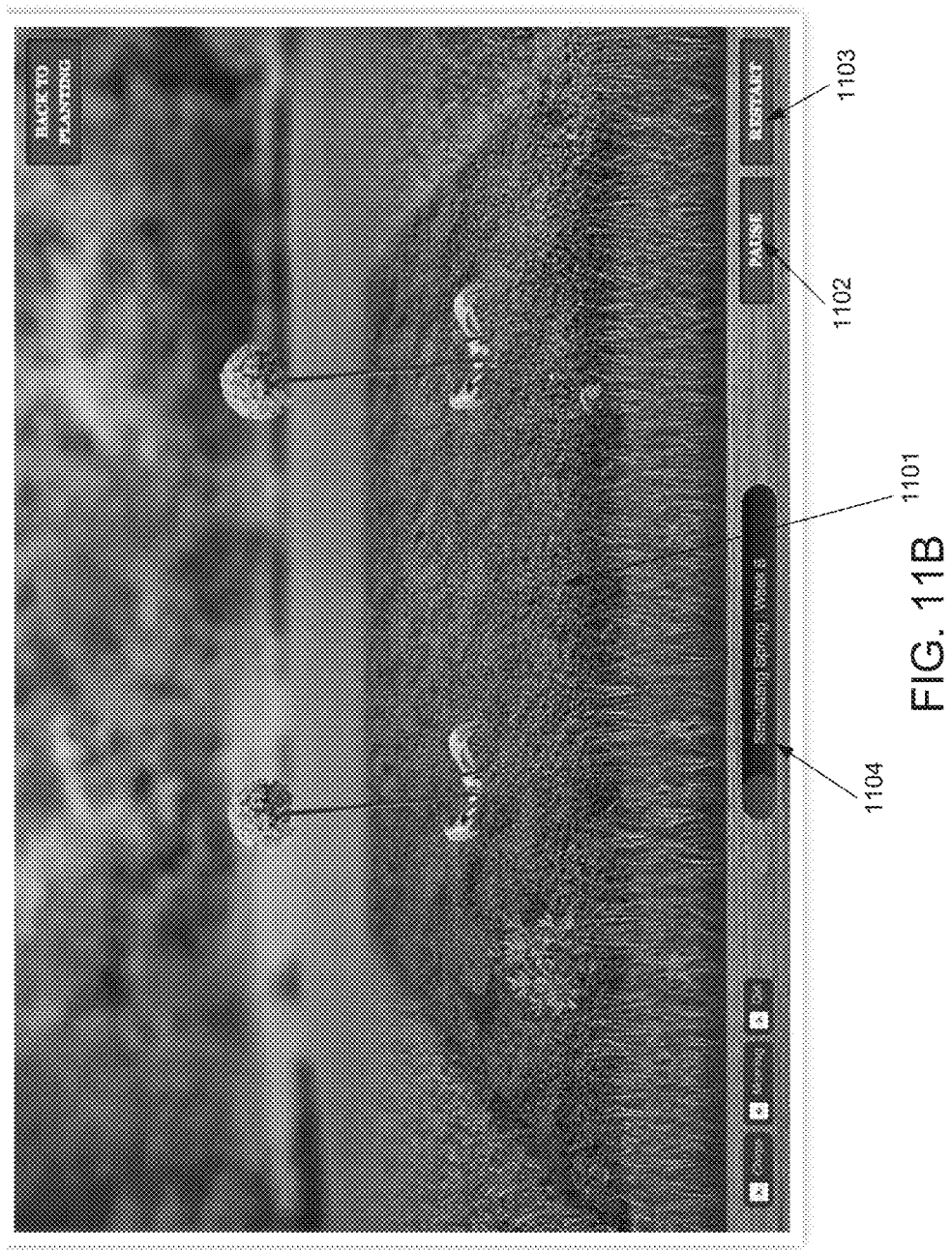

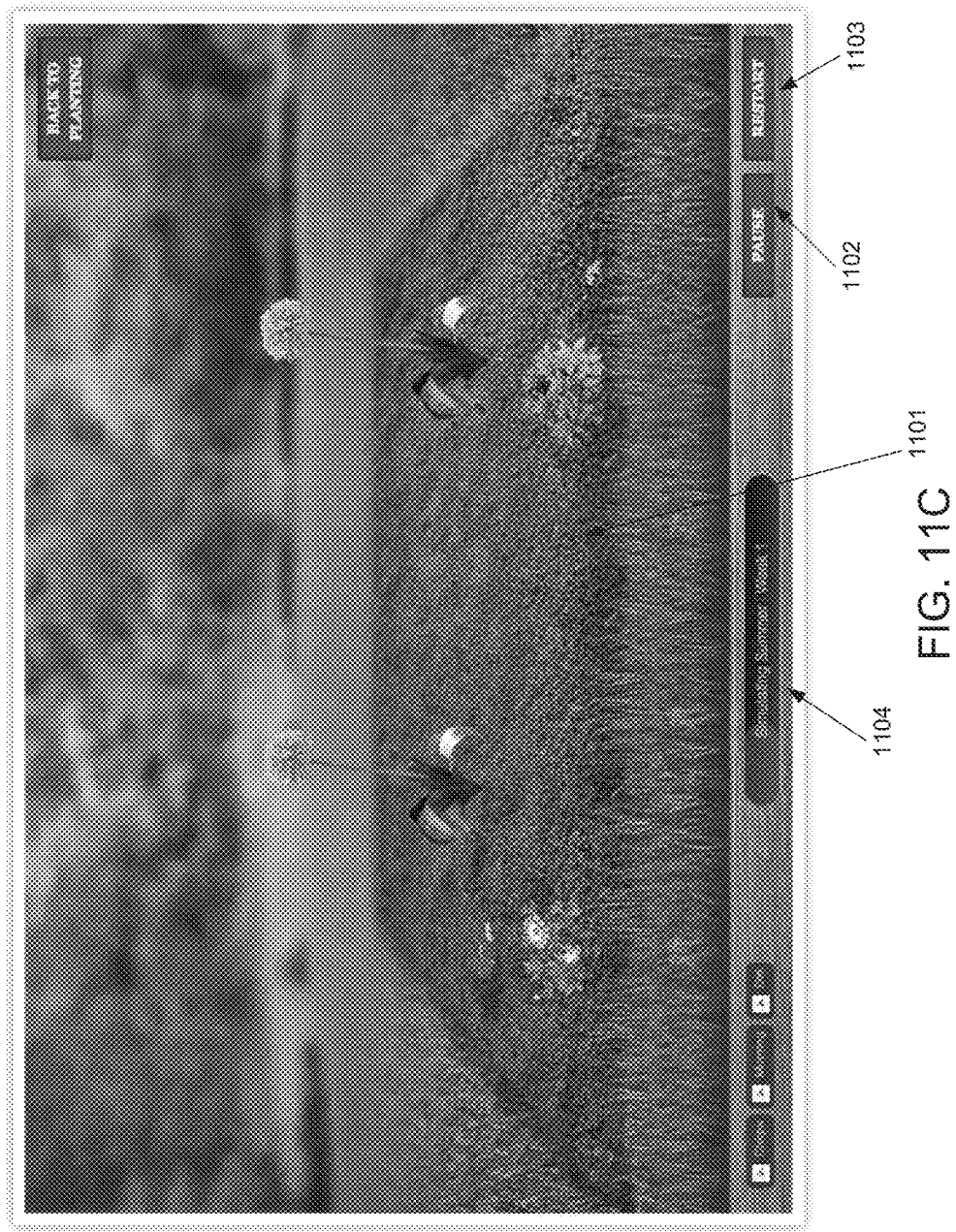

1201
- Design plot:
  - plot_dropzone_height
  - plot_dropzone_width
- Simulation plot:
  - sim_zone_width
  - sim_zone_height 1202
X = coordinate along x-axis of plant within design plot Y = coordinate along y-axis of plant within design plot Plant_size = calculated plant height 1203
adj_xpos_factor = sim_zone_width/plot_dropzone_width adj_ypos_factor = sim_zone_height/plot_dropzone_height 1204
new_x_pos = x * adj_xpos_factor new_y_pos = sim_zone_height – (y * adj_ypos_factor)

1205
scale_by_y_placement_factor = 1 – adj_ypos_factor adj_ypos_factor2 = new_y_pos/sim_zone_height 1206
Plant_final_size = plant_size * scale_by_y_placement_factor final_y_pos = new_y_pos * scale_by_y_placement_factor final_x_pos (Sec. A) = new_x_pos + ((1 – scale_by_y_placement_factor) * (ceiling (width of segment A))

final_x_pos (Sec. B) = new_x_pos final_x_pos (Sec. C) = new_x_pos + ((1 – scale_by_y_placement_factor) * (ceiling (width of segment C))

FIG. 13

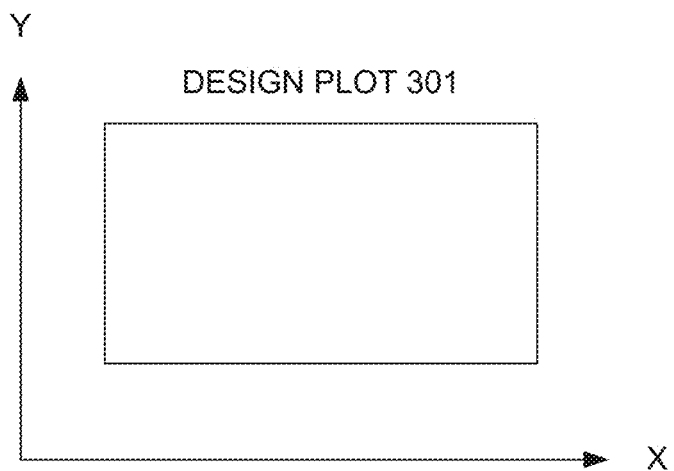
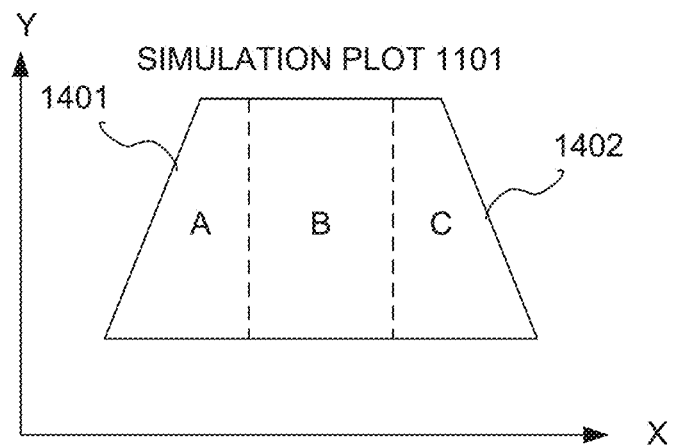
FIG. 14

GARDEN SIMULATION

BACKGROUND OF THE INVENTION

Electronic garden planners exist as tools for gardeners in designing a garden. However, current garden planners are static, using drawings or photographs to show the garden at one point in time during the season, and do not take into account what the garden may look like at other times of the year. For example, a plant may bloom for two weeks during the season but may have vegetation for the entire year. Thus, displaying the look of the garden during the two-week blooming period would not give the gardener a view of the garden during the non-blooming stage. Further, many current garden planners do not account for the differing bloom times of plants. Instead, they display a garden as if all plants bloom at the same time.

BRIEF SUMMARY OF THE INVENTION

According to one embodiment of the present invention, in providing a simulation of a garden, a selection of one or more plants and a placement of the selected plants in a design plot for the garden are received, where the design plot displaying the garden with an orthogonal view. The plurality of images and the placement of each selected plant are stored. A command to run a simulation of the garden is received, where the simulation comprising a plurality of time periods. In response to the command, adjusting a size and the placement of the plurality of images of each selected plant for display in a simulation plot, the simulation plot displaying the garden in a perspective view. For each selected plant, the adjusted images at the adjusted placements for each time period in the simulation are displaying in the simulation plot.

In one aspect of the present invention, for a given plant of the plurality of plants, the adjusting of the size and the placement comprises: determining design plot dimensions and simulation plot dimensions; determining coordinates of the given plant in the design plot and a plant size of the given plant; determining coordinate adjustment factors for translation from the orthogonal design plot display to the perspective simulation plot display; applying the coordinate adjustment factors to the coordinates of the given plant to obtain new coordinates of the given plant; determining a placement scaling factor and a plant size scaling factor for the given plant for depth of field translation from the orthogonal design plot display to the perspective simulation plot display; applying the plant size scaling factor to the plant size of the given plant to obtain a final plant size for the given plant; and applying the placement scaling factors to the new coordinates of the given plant to obtain final coordinates of the given plant.

In one aspect of the present invention, when it is determined that a given plant is selected by a user and placed within the design plot, the placement of the given plant within the design plot is determined, and a plurality of images of the given plant are retrieved from a database comprising information for a plurality of plants. The plurality of images and the placement of the given plant are then stored prior to running the simulation.

In one aspect of the present invention, one or more search filter attributes for characteristics of the plurality of plants are received, comprising one or more of the following: category; subcategory; color; light; height; zone; and blooming period. The one or more search filter attributes are applied to the database, and information for one or more plants in the database that satisfy the one or more search filters are displayed.

In one aspect of the present invention, an upload of a plurality of images of a given plant is received. A configuration of an image timeline for the given plant is also received, comprising the uploaded plurality of images of the given plant. During the simulation, the plurality of images of the given plant are displayed as configured in the image timeline.

System and computer program products corresponding to the above-summarized methods are also described and claimed herein.

BRIEF DESCRIPTION OF THE SEVERAL VIEWS OF THE FIGURES

FIGS. 11A-11F illustrate user interfaces displaying the simulation according to embodiments of the present invention.

FIG. 13 illustrates in an example of the adjustment of the size and coordinates of the images of each plant for display in a simulation according to embodiments of the present invention.

FIG. 14 illustrates example design and simulation plots according to embodiments of the present invention.

DETAILED DESCRIPTION OF THE INVENTION

The following description is presented to enable one of ordinary skill in the art to make and use the present invention and is provided in the context of a patent application and its requirements. Various modifications to the embodiment will be readily apparent to those skilled in the art and the generic principles herein may be applied to other embodiments. Thus, the present invention is not intended to be limited to the embodiment shown but is to be accorded the widest scope consistent with the principles and features described herein.

Embodiments of the present invention provide a website for facilitating the design of a garden. The website allows a user to design a garden on-line, and then provide a visual simulation of the appearance of the garden through a time sequence spanning multiple growing seasons. The user designs the garden by selecting plants through an interactive user interface and positioning each selected plant onto a "design plot", which provides an orthogonal view of the garden design. The growths of the plants in the garden are then simulated on a "simulation plot", which provides a perspective view of the growth cycles of garden as a whole. The simulation simultaneously displays images of each plant in the garden through different growth periods, which may include both blooming and non-blooming times. Through the simulation, the user may see what his or her garden would look like through the season(s) prior to actual planting. The user may modify the garden design and rerun the simulation multiple times.

Figure 1:
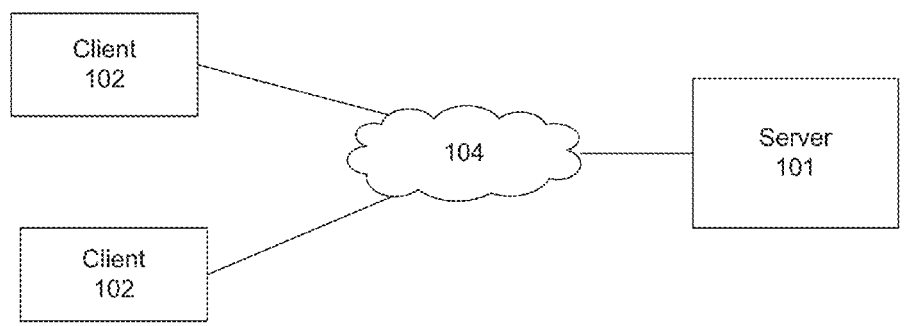
FIG. 1 illustrates a system for simulating a garden according to embodiments of the present invention.

FIG. 1 illustrates a system for simulating a garden according to embodiments of the present invention. The system includes a server 101 for providing the web pages through which a user, via a client 102 may use the garden simulation, as described above. One or more clients 102 communicate with the server 101 over a network 104, such as the Internet. The server 101 and each client 102 include a computer system, as illustrated in FIG. 2.

Figure 2:
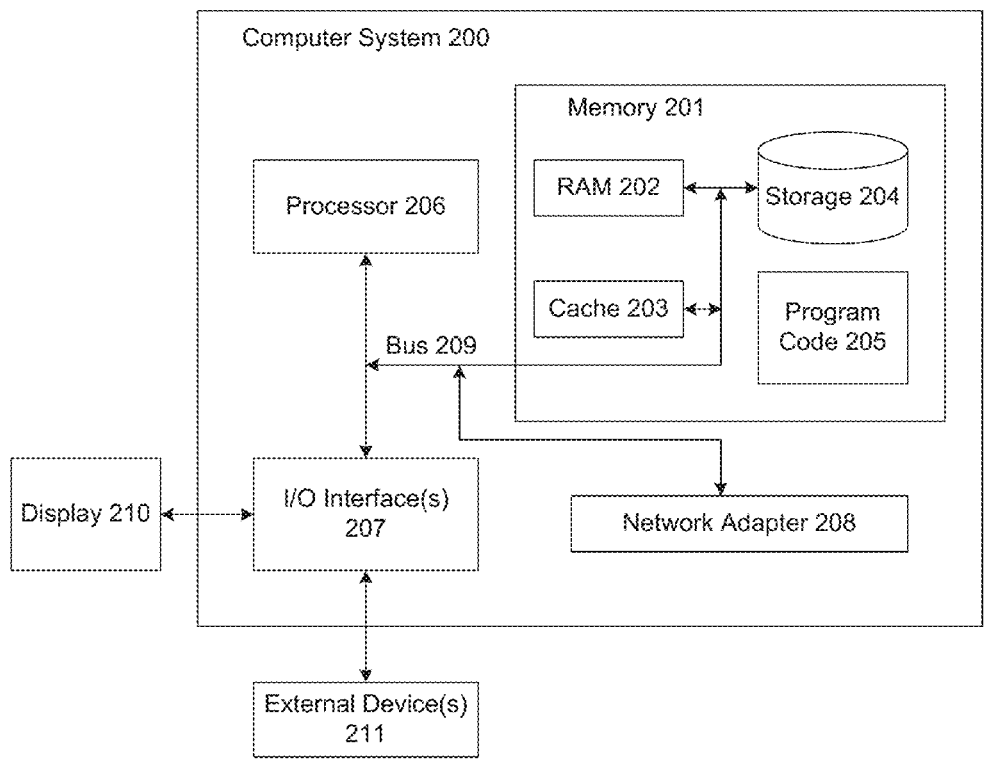
FIG. 2 illustrates a computer system according to embodiments of the present invention.

FIG. 2 illustrates a computer system according to embodiments of the present invention. The computer system 200 is operationally coupled to a processor or processing units 206, a memory 201, and a bus 209 that couples various system components, including the memory 201 to the processor 206. The bus 209 represents one or more of any of several types of bus structure, including a memory bus or memory controller, a peripheral bus, an accelerated graphics port, and a processor or local bus using any of a variety of bus architectures. The memory 201 may include computer readable media in the form of volatile memory, such as random access memory (RAM) 202 or cache memory 203, or non-volatile storage media 204. The memory 201 may include at least one program product having a set of at least one program code module 205 that are configured to carry out the functions of embodiment of the present invention when executed by the processor 206. The computer system 200 may also communicate with one or more external devices 211, such as a display 210, via I/O interfaces 207. The computer system 200 may communicate with one or more networks via network adapter 208.

Figure 3:
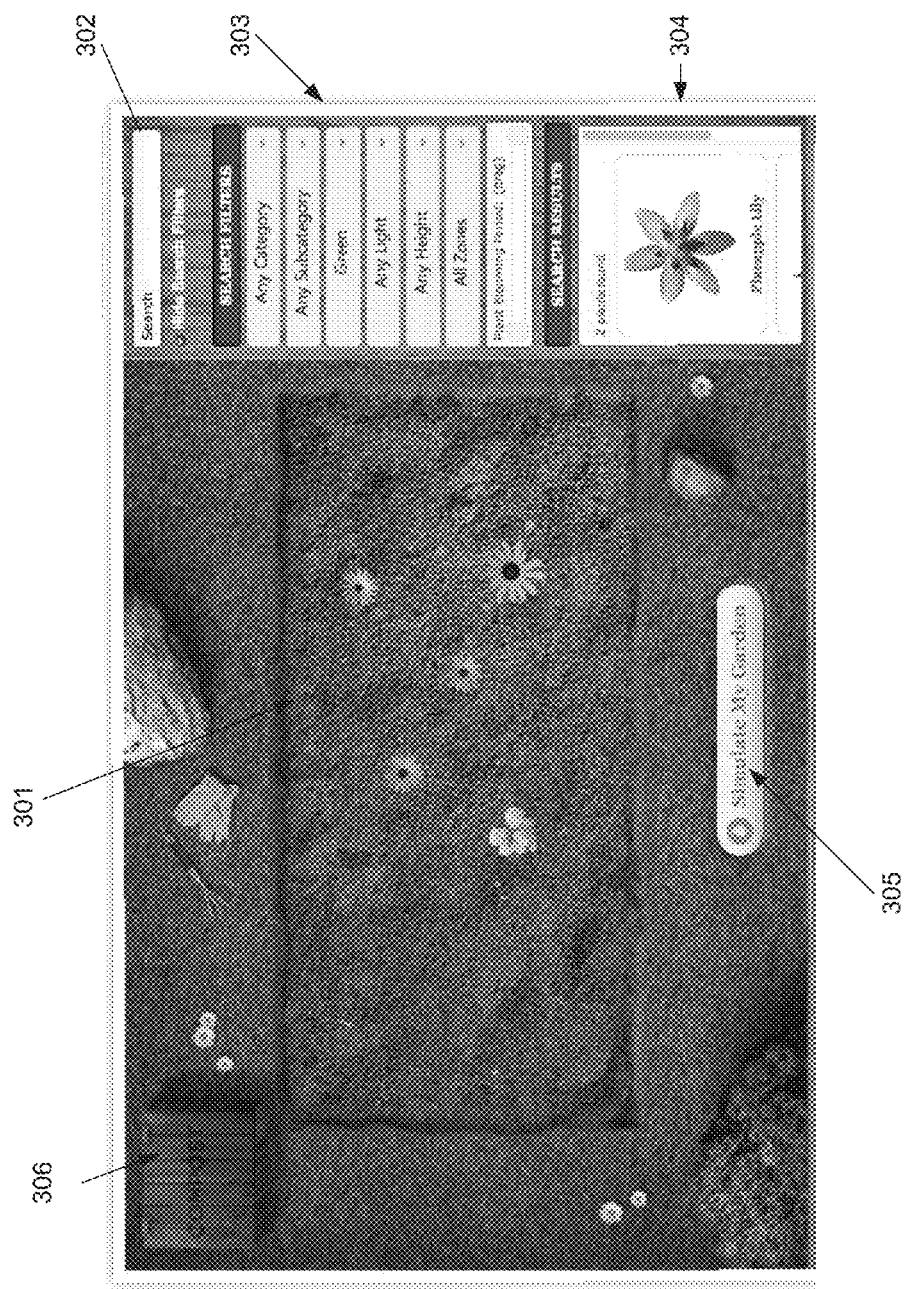
FIG. 3 illustrates a user interface for online garden design according to embodiments of the present invention.
Figure 4:
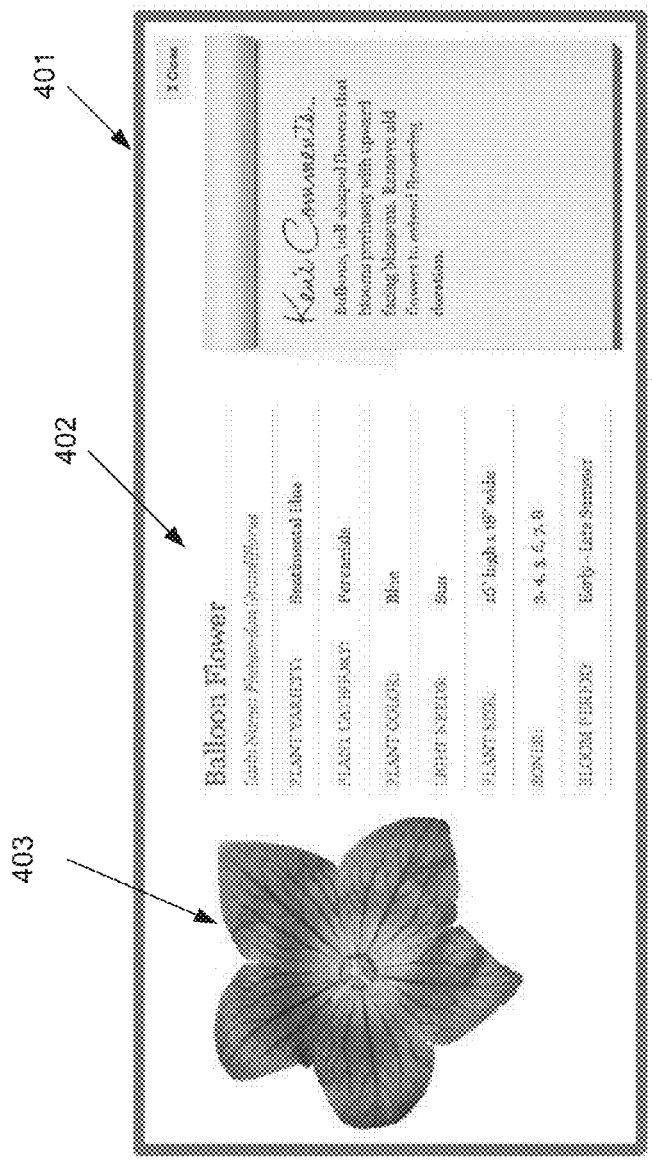
FIG. 4 illustrates a modal window to display additional information concerning a plant according to embodiments of the present invention.

FIG. 3 illustrates a user interface for online garden design according to embodiments of the present invention. The user interface includes a design plot 301, a search field 302, and a set of search filters 303 by characteristics of plants in a database storing information on a plurality of plants. Example filters include: category (e.g. perennials, annuals, etc.), subcategory (e.g. under perennials, sub-categories may be daisy, mums, lilies, etc.), greenery or color (e.g. blue, yellow, etc.), light (e.g. shade, full sun, partial sun, etc.), height (e.g. short, medium, tall, etc.), zone (e.g. zone 1, zone 2, . . . , zone 12), or blooming period (e.g., mid-summer to late-fall, etc.) attributes. The user interface further includes a view of search results 304, a button 305 to initiate the simulation, and a "compost bin" 306 for removing elements in the garden design. To design a garden, the user first selects a plant. The user may search for the plant by entering keywords into the search field 302. Optionally, the user may filter the search by indicating one or more of the filters 303. The results of search would be displayed in the search results view 304. As the filters are selected, the view of search results 304 is updated. In this embodiment, images of the plants in the search results are displayed. To view more information on a particular plant in the search results, the user hovers a pointer over the plant, upon which additional information is displayed on the user interface (not shown). Optionally, as illustrated in FIG. 4, the user may select a plant in the search results, which causes a modal window 401 to display with additional information 402 concerning the plant, along with a larger image of the plant 403.

Upon finding the desired plant, the user may add the plant to the garden by dragging the plant from the search results view 304 and dropped onto a position within the design plot 301. While dragging, visual cues are displayed which indicate that the plant is being actively dragged. For example, an image of the plant may be displayed as the plant is being dragged. The scale of the image of the plant is shown in proportion to the size of the design plot. This ensures an accurate representation of the relative sizing and placement of plants within the context of a real world garden plot represented by the design plot 301. The user may move or change the placement or positioning of a plant within the design plot 301 by dragging and dropping the plant to another position within the design plot 301. During dragging, the user is again presented with visual cues to identify the plant as being actively moved. To remove a plant, the user drags and drops the plant from its current position within the design plot 301 to the compost bin 306. The entire garden design may be removed by double-clicking on the compost bin 306.

Figure 5:
FIG. 5 illustrates a user interface for managing plant inventory according to embodiments of the present invention.

The inventory of plants and their attributes are maintained in a database and managed by an administrator. Once a user with administrative permissions logs into the system and is authenticated, a user interface for managing plant inventory is displayed. FIG. 5 illustrates a user interface for managing plant inventory according to embodiments of the present invention. The user interface displays the records for the plants stored in the database. Each record includes the name of the plant 501 and its associated attributes 502-506, as set by the administrator. The attributes comprise the category attribute 502, a timeline attribute 503 indicating the number of photos available for use in the simulation, the access attribute 504 indicating what users may access the plant during the design process, and status attribute 505 indicating whether the plant is available at all during the design process. The status attribute 505 allows the administrator to remove a plant from the design process without deleting the plant from the database. The user interface further displays the plant controls 506 for editing information for the plant, managing photos of the plant to be used during the garden simulation, and for deleting the record for the plant from the database. The administrator may also choose to add a new plant into the database by selecting an "add plant" button 507.

Figure 6:
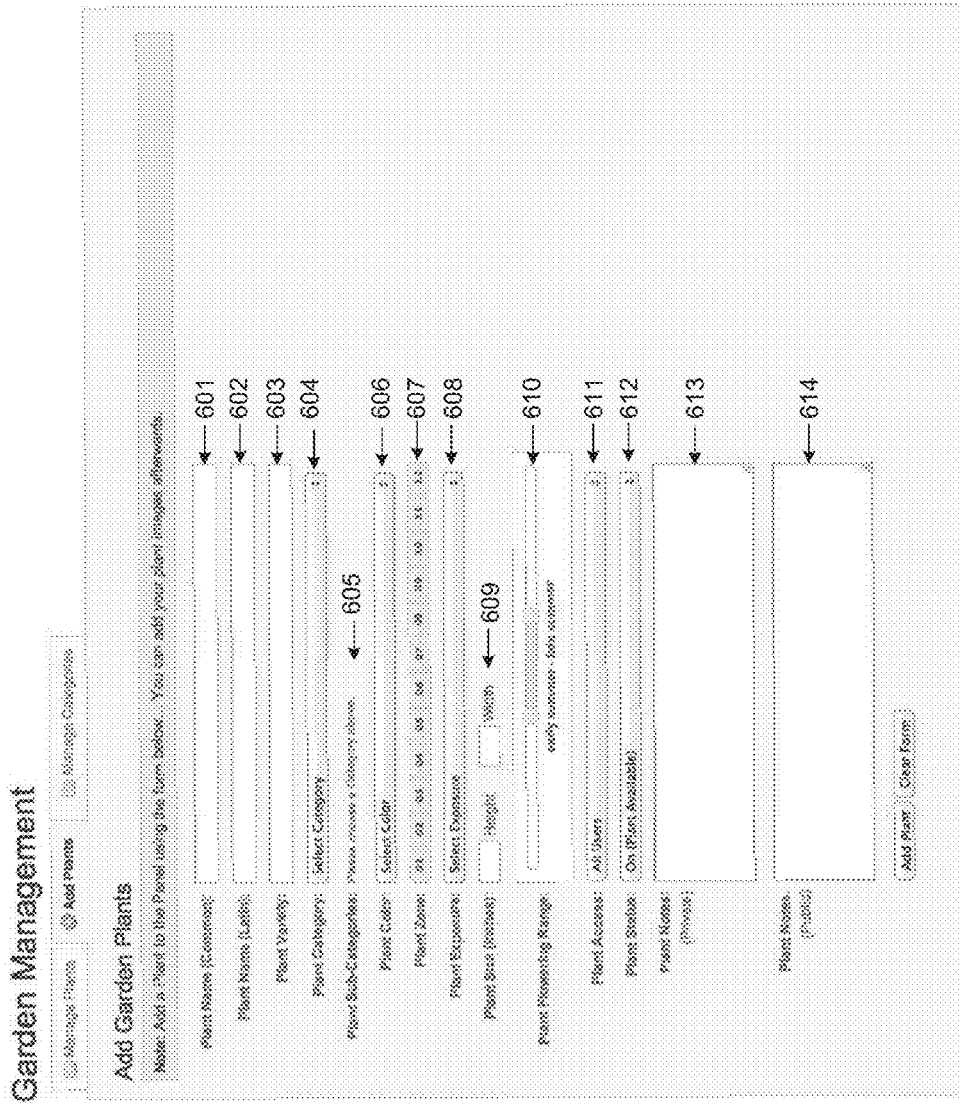
FIG. 6 illustrates a user interface for adding plants to the plant inventory according to embodiments of the present invention.

FIG. 6 illustrates a user interface for adding plants to the plant inventory according to embodiments of the present invention. Information recorded for each plant includes: common plant name 601; Latin plant name 602; plant variety 603; plant category 604; plant sub-category 605; plant color 606; plant zone 607; plant exposure 608; plant size 609; plant flowering range 610; plant access 611 for setting the access attribute 504; and plant status 612 for setting the status attribute 505. Other information recorded comprises private plant notes 613 and public plant notes 614. Private plant notes are text stored in the database, viewable by the administrator, but not posted for viewing by other users. Public plant notes are text that is posted for viewing by other users.

Figure 7:
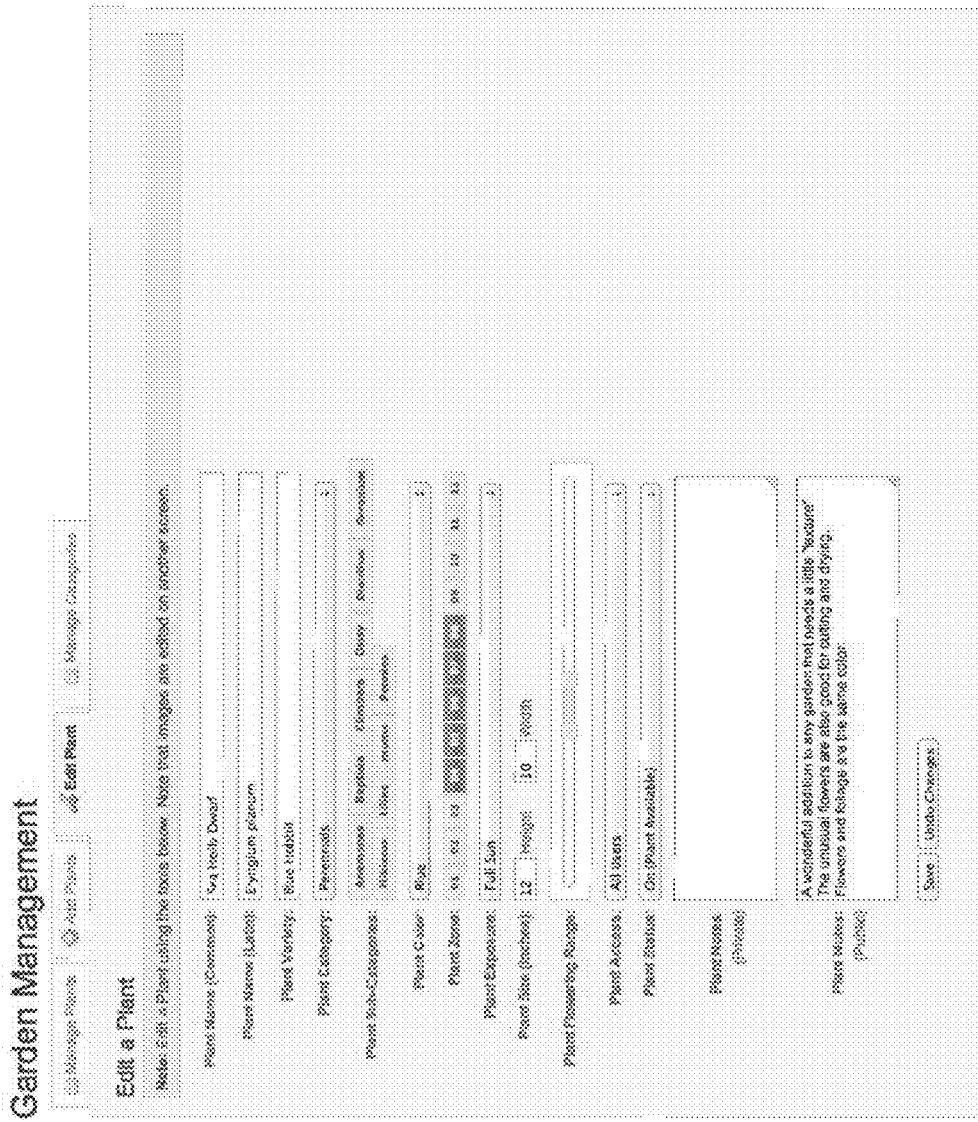
FIG. 7 illustrates a user interface for editing plant information according to embodiments of the present invention.

Plant information may be edited at any time by selecting the Edit Plant button 508 in the managing plant inventory user interface (see FIG. 5). FIG. 7 illustrates a user interface for editing plant information according to embodiments of the present invention. Assume that the Edit Plant button 508 for the Sea Holly Dwarf was selected. In response, an Edit a Plant user interface, as illustrated in FIG. 7, is displayed. The user interface displays the existing information for the Sea Holly Dwarf, and any of the information may then be changed and saved.

Figure 8:
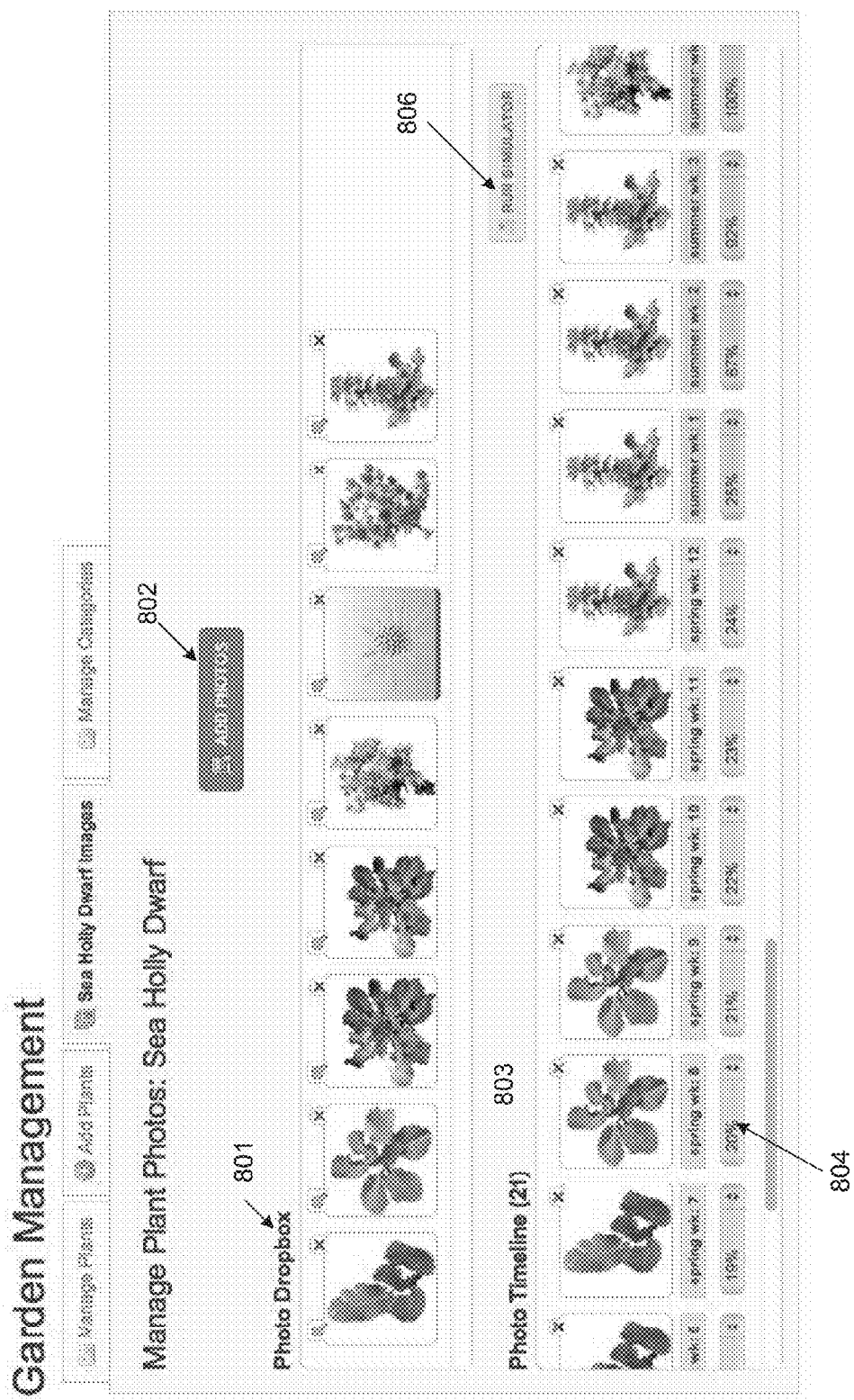
FIG. 8 illustrates a user interface for managing plant photos according to embodiments of the present invention.
Figure 9:
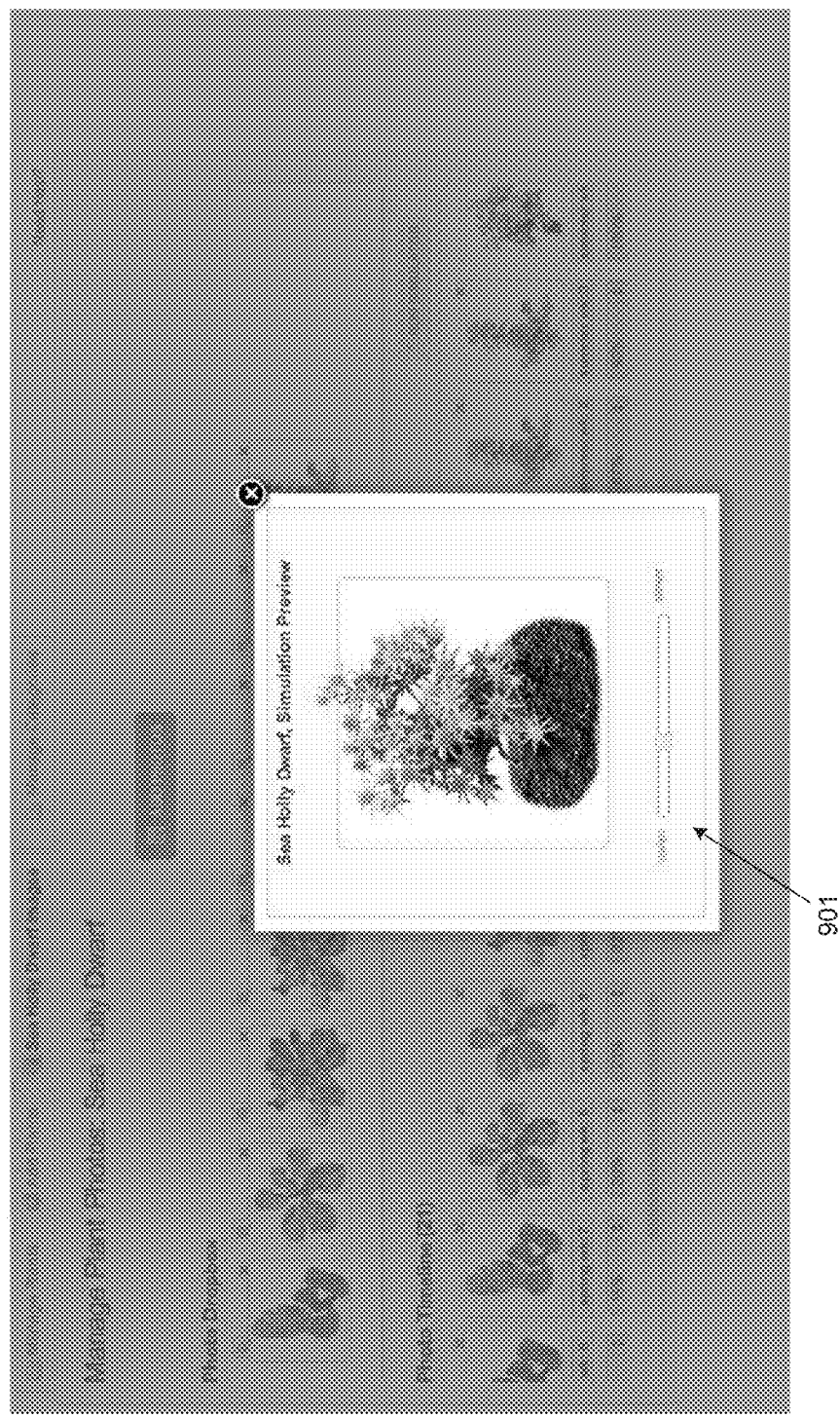
FIG. 9 illustrates a window displayed for previewing the simulation according to embodiments of the present invention.

To add or manage the photos of the plant to be used during the garden simulation, the Photos button 509 in the Plant Controls 506 (see FIG. 5) may be selected. FIG. 8 illustrates a user interface for managing plant photos according to embodiments of the present invention. Assume that the Photos button 509 for the Sea Holly Dwarf was selected. In response, a Manage Plant Photos user interface, as illustrated in FIG. 8, is displayed. If one or more photos of the plant already exist in the database, these photos are displayed in the Photo Dropbox 801. New photos may be uploaded to Photo Dropbox 801 by selecting the Add Photos button 802. In this embodiment, each time slot is configured with a photo representing the stage of the plant at that time of the year. For example, photos of the plant foliage, in bud, in bloom, and post bloom, as well as a close up photo of the plant, may be uploaded. The photos in the Photo Dropbox 801 may then be used to create the Photo Timeline 803. The photo timeline configures which photo of the plant is used for which time period in the simulation. Photos are arranged into a time sequence which ranges from Spring week 1 through 12 to Winter weeks 1 through 12. For example, if a plant begins sprouting in the third week of Spring, the photo of the sprouting plant is configured in the Spring week 3 time slot. A reference size may also be entered into the reference size field 804 for each photo in the photo timeline 803. The reference size 804 ensures that the photo is displayed in the correct size in relation to the other photos in the photo timeline 803. For example, if the sprout in the Spring week 3 time slot is 10% of the final plant size, then 10% is entered into the reference size field 804 of that time slot. The simulation using the photos in the timeline 803 may be previewed by selecting the Run Simulation button 806 to confirm performance. As illustrated in FIG. 9, upon the selection of the Run Simulation button 806, a separate window 901 is displayed, in which the simulation can be previewed.

Returning to the designing of the garden illustrated in FIG. 3, as a plant is selected and dropped into the design plot 301 by the user, the plant's placement is saved so as to be able to place the plant properly when the simulation runs. Also, the plant images that will be used in the simulation are fetched and cached by the browser so that they will be ready when the user wishes to run the simulation. This preloading of images ensures that the user has a fast and responsive experience when viewing the simulation.

Figure 10:
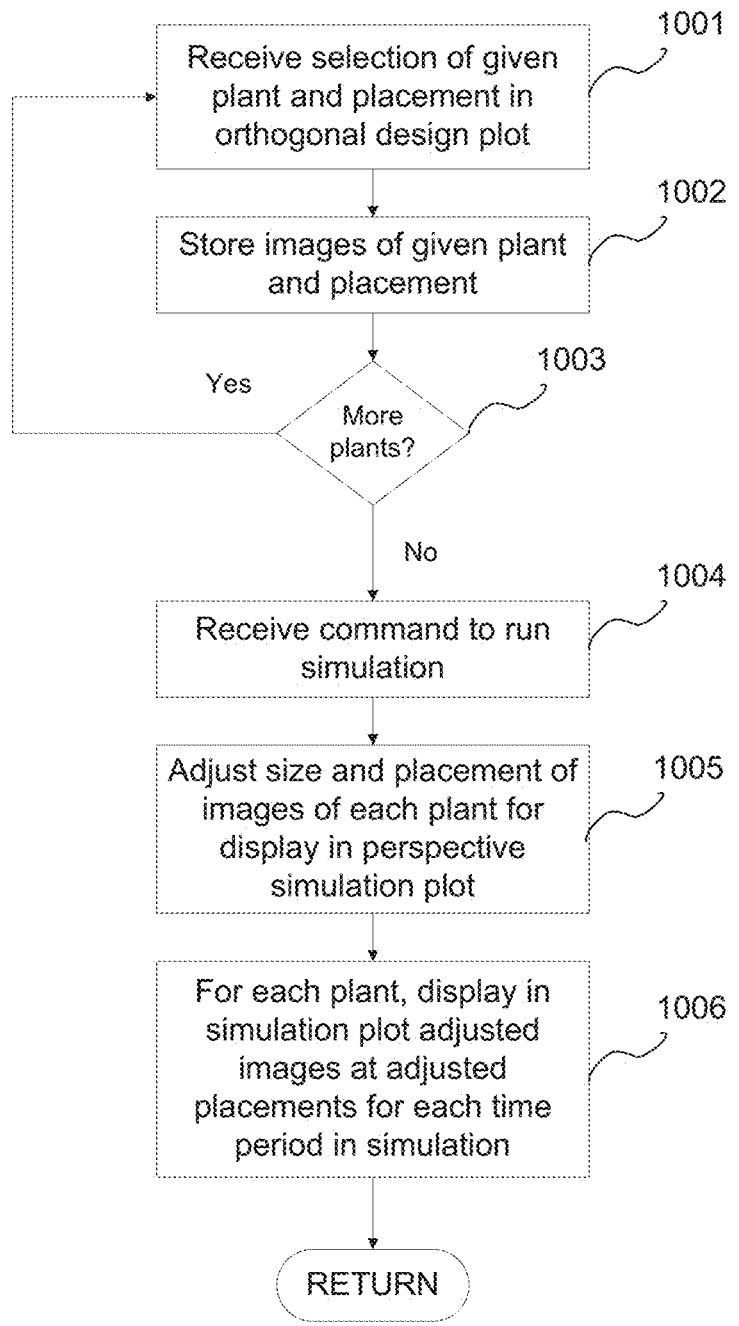
FIG. 10 is a flowchart illustrating a garden simulation according to embodiments of the present invention.
Figure 11A:
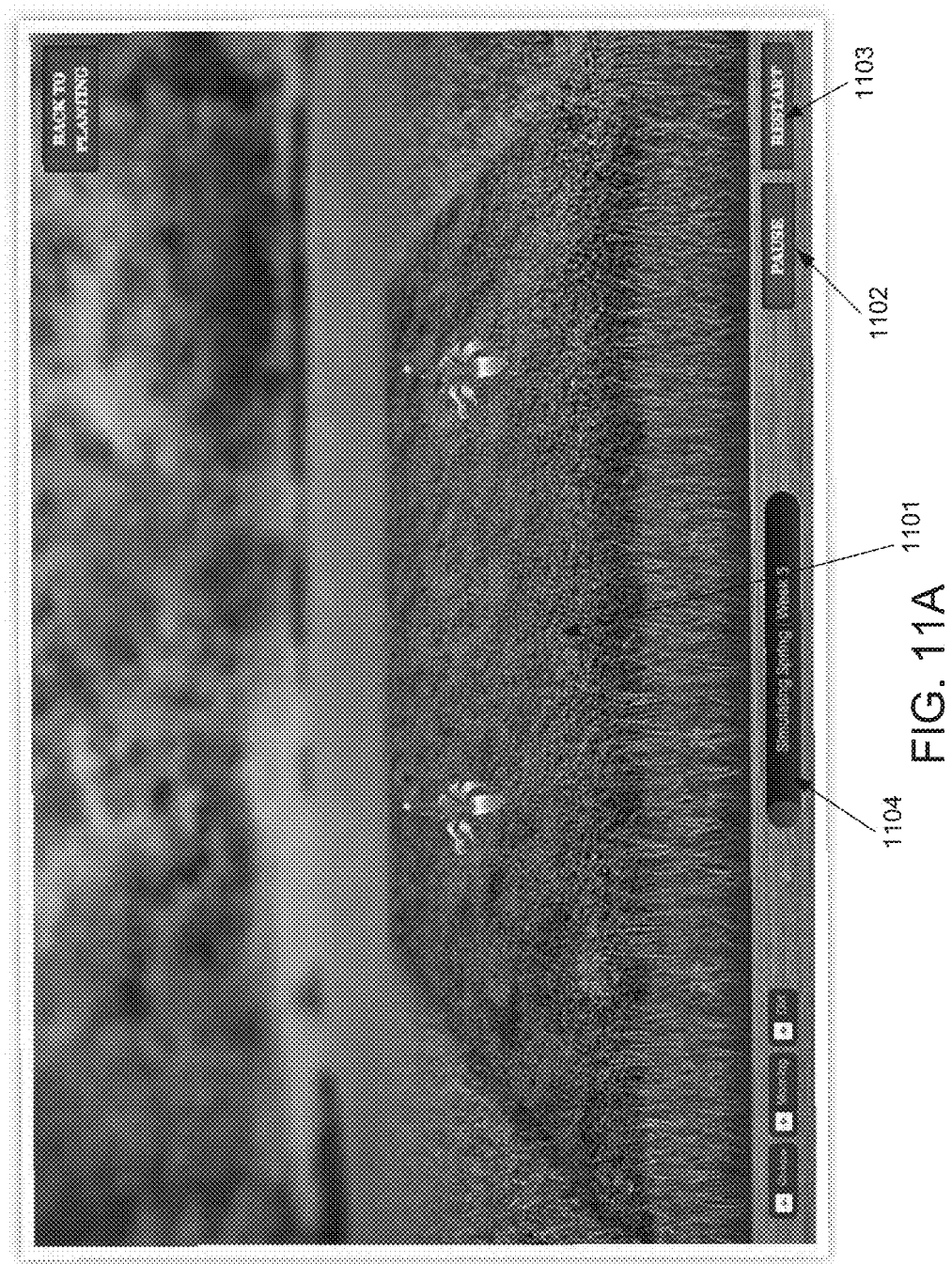
Figure 11D:
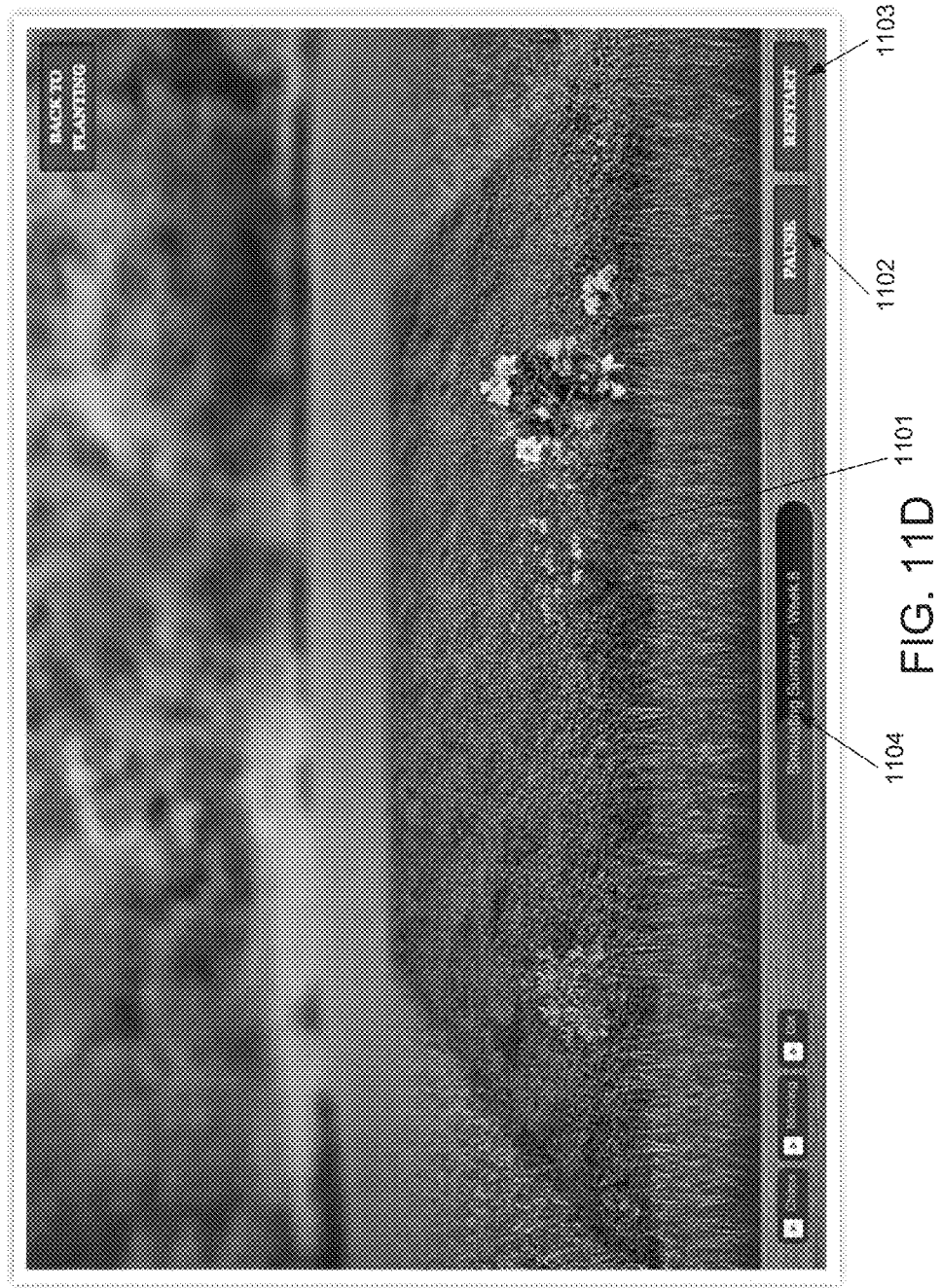
Figure 11E:
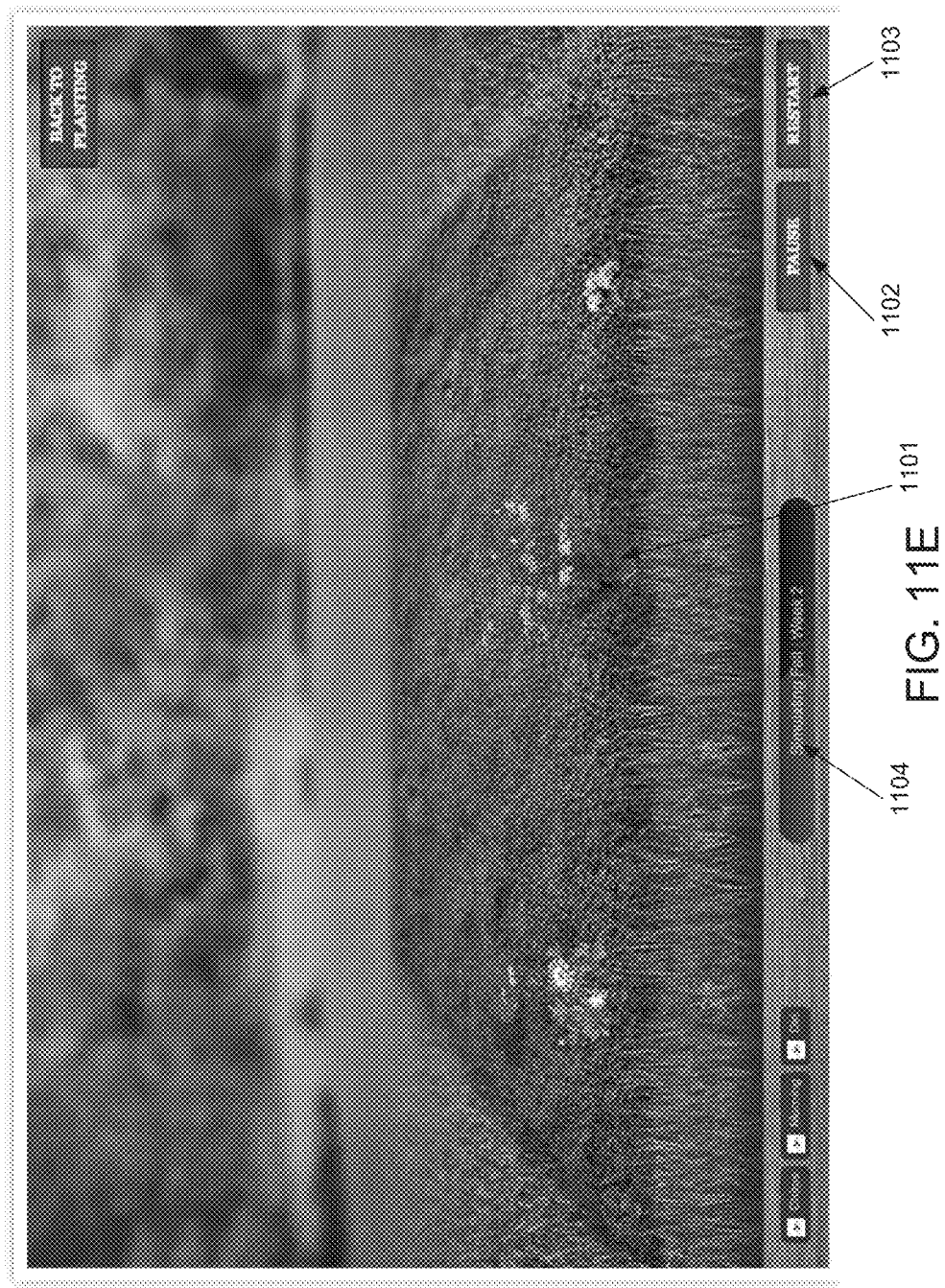
Figure 11F:

FIG. 10 is a flowchart illustrating a garden simulation according to embodiments of the present invention. Prior to the running of simulation, a selection of a given plant, and the placement of the given plant in the design plot 301, is received (1001). Note that the design plot 301 is displayed orthogonally. The images of the given plant are then preloaded, as explained above. The images and the placement of the given plant are then stored (1002). Steps 1001 and 1002 are repeated for each plant selected and placed into the design plot 301 (1003). In this embodiment, after at least one plant is selected and positioned within the design plot 301, a "Simulate My Garden" button 305 is made available to the user. When the user selects the button 305, a command to run the simulation is sent to the server 101 (1004). In response to receiving the command, the server 101 runs the simulation. FIGS. 11A-11F illustrate user interfaces displaying the simulation according to embodiments of the present invention. Each of FIGS. 11A-11F illustrates the display of one of the time periods in the simulation. An image of each plant in the design plot 301 is displayed in the simulation plot 1101, for each time period in the simulation. The server 101 steps through each week in the simulation, displaying the images of each plant for that week in parallel. The user interface includes an indication 1104 of the time period currently being displayed. Note that the simulation plot 1101 displays the simulation in a perspective view in order to provide the user with a more realistic idea of the growth of the garden over time. The simulation may be paused and restarted by selecting the Pause button 1102 and the Restart button 1103, respectively. Returning to FIG. 10, in running the simulation, the server 101 adjusts the size and coordinates of the images of each plant in the associated array for display in the simulation plot 1101 (1005). The adjustments of the size and coordinates are to translate display of each plant from the orthogonal view of the design plot 301 to the perspective view of the simulation plot 1101. Then, for each plant, the server displays, in the simulation plot 1101, the adjusted images at the adjusted coordinates for each time period in the simulation (1006).

Figure 12:
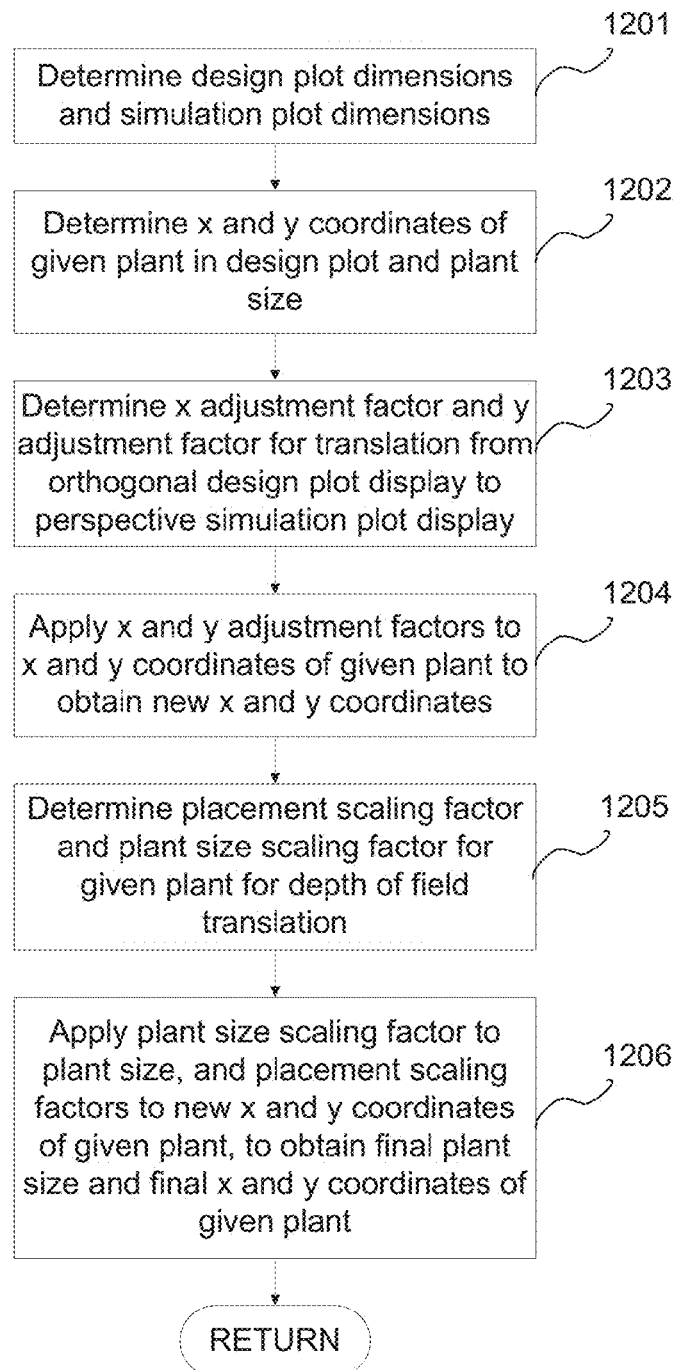
FIG. 12 is a flowchart illustrating in more detail the adjustment of the size and coordinates of the images of each plant for display in the simulation according to embodiments of the present invention.

FIG. 12 is a flowchart illustrating in more detail the adjustment of the size and coordinates of the images of each plant for display in the simulation according to embodiments of the present invention. First, the server 101 determines the dimensions of the design plot 301 and the simulation plot 1101 (1201). The x and y coordinates of the given plant in the design plot 101 and the given plant's size are also determined (1202). As explained above, in one embodiment, the x and y coordinates are saved as the given plant is dropped into the design plot 301. The server 101 then determines the x adjustment factor and the y adjustment factor for translation from the orthogonal design plot display to the perspective simulation plot display (1203). The x and y adjustment factors are then applied to the x and y coordinates of the given plant to obtain new x and y coordinates (1204). A placement scaling factor and a plant size scaling factor are determined for the given plant for depth of field translation (1205). The server 101 applies the plant size scaling factor to the plant size, and applies the placement scaling factor to the new x and y coordinates, of the given plant to obtain the final plant size and the final x and y coordinates in the simulation plot 1101 (1206). During the simulation, each image of the given plant in each time period of the simulation is displayed with the final plant size and at the final x and y coordinates in the simulation plot 1101.

FIG. 13 illustrates in an example of the adjustment of the size and coordinates of the images of each plant for display in a simulation according to embodiments of the present invention. In this example, shapes of the design plot 301 and the simulation plot 1101 as illustrated in FIG. 14 are used. The shape of the design plot 301 is rectangular, with coordinates set along x- and y-axes as illustrates. The coordinates of the simulation plot 1101 are set along the same x- and y-axes, however, because the simulation is displayed in a perspective view, a simulation plot 1101 has a trapezoidal shape long the axes. In translating between the design plot 301 and the simulation plot 1101, or between any shaped design and simulation plots, two attributes of the given plant are considered: size and placement.

Referring to both FIGS. 12 and 13, the server 101 determines the design plot dimensions (plot_dropzone_height and plot_dropzone_width) and the simulation plot dimensions (sim_zone_width and sim_zone_height) (1201). The x and y coordinates (x and y) of the given plant in the design plot 301 and the plant size (plant_size) are determined (1202). Here, the plant size is for calculation purposes based on the height of the plant being simulated. The reference size of the given plant configured in the reference size field 804 (see FIG. 8) is taken into account here. The x adjustment factor (adj_pos_factor=sim_zone_width/plot_dropzone_width) and the y adjustment factor (adj_ypos_factor=sim_zone_height/plot_dropzone_height) are determined (1203). The scaling factors determined in step 1203 will be used to translate the plant image from an orthogonal view in the design plot 301 to a perspective view in the simulation plot 1101. The x adjustment factor (adj_xpos_factor) and the y adjustment factor (adj_ypos_factor) are applied to the x and y coordinates (x and y) of the given plant to obtain a new x coordinate (new_x_pos=x*adj_xpos_factor) and a new y coordinates (new_y_pos=sim_zone_height−(y*adj_ypos_factor) (1204). In this example, the new y coordinate is determined in a "top down" manner along the y-axis. The placement scaling factor (adj_ypos_factor2=new_y_pos/sim_zone_height) and the plant size scaling factor (scale_by_y_placement_factor=1−adju_ypos_factor2) are determined 1205. These scaling factors determined in step 1205 will be used for depth of field translation. The plant size scaling factor is then applied to the plant size to obtain the final plant size (plant_final_size=plant_size*scale_by_y_placement_factor), and the placement scaling factors are applied to obtain the new y coordinates of the given plant to obtain the final coordinates (final_y_pos=new_y_pos*scale_by_y_placement_factor) (1206). In determining the final x coordinates, the simulation plot 1101 is divided into three segments A, B, and C (see FIG. 14). The division of the simulation plot 1101 is in recognition of the fact that the slope of the edge 1401 of segment A differs from the slope of the edge 1402 of segment C, requiring additional adjustments of the x coordinate. Coordinates in segment B do not require such additional adjustments. In this example, the final x coordinate in segment A: final_x_pos=new_x_pos+((1−scle_by_y_placement_factor)*(ceiling (width of segment A)). The final x coordinate in segment B: final_x_pos=new_x_pos. The final x coordinate in segment C: new_x_pos+((1−scale_by_y_placement_factor)*(ceiling (width of segment C)). The "ceiling" of the width of the segment is used because in this example, the y coordinate is calculated from the "top down" along the y-axis.

According to embodiments of the present invention, the simulation is a loop of the four seasons in the year with twelve weeks in each season. Other manners of determining the time periods in the simulation may be used. Certain images appear and then fade out as soon as the next step in the loop takes place. As each image is displayed, the sizing and placement are taken into account as set forth above. The sizing and placement adjustments are calculated for every plant in the simulation in parallel so there are multiple iterations of the simulation logic running in parallel. Options to pause and resume the simulation may be provided to the user via a pause and resume buttons on the user interface.

Although the present invention is described above with the illustrated shape of the design and simulation plots, other shapes may be used. Further, the garden simulation tool may be provided as an on-line tool or an off-line tool without departing from the spirit and scope of the present invention.

The present invention can take the form of an entirely hardware embodiment, an entirely software embodiment or an embodiment containing both hardware and software elements. In a preferred embodiment, the present invention is implemented in software, which includes but is not limited to firmware, resident software, microcode, etc.

Furthermore, the present invention can take the form of a computer program product accessible from a computer-usable or computer-readable medium providing program code for use by or in connection with a computer or any instruction execution system. For the purposes of this description, a computer-usable or computer readable medium can be any apparatus that can contain, store, communicate, propagate, or transport the program for use by or in connection with the instruction execution system, apparatus, or device.

The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, point devices, etc.) can be coupled to the system either directly or through intervening I/O controllers.

Network adapters may also be coupled to the system to enable the data processing system to become coupled to other data processing systems or remote printers or storage devices through intervening private or public networks. Modems, cable modem and Ethernet cards are just a few of the currently available types of network adapters.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified local function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A method for providing a simulation of a garden, comprising:
    (a) receiving, by a computing processor, a selection of one or more plants and a placement of the selected plants in a design plot for the garden, the design plot displaying the garden without a depth of field;
    (b) storing, by the computing processor, a plurality of images and the placement of each selected plant;
    (c) receiving, by the computing processor, a command to run a simulation of the garden, the simulation comprising a plurality of time periods;
    (d) in response to the command, adjusting, by the computing processor, a size and the placement of the plurality of images of each selected plant by translating the design plot display of the garden without the depth of field to the simulation plot display of the garden with a depth of field, the translating comprising:
        (d1) determining design plot dimensions and simulation plot dimensions;
        (d2) determining coordinates of the given plant on a first set of axes of the design plot and a plant size of the given plant;
        (d3) determining coordinate adjustment factors for translating from the design plot display without the depth of field to the simulation plot display with the depth of field;
        (d4) applying the coordinate adjustment factors to the coordinates of the given plant to obtain new coordinates of the given plant on a second set of axes of the simulation plot;
        (d5) determining a placement scaling factor and a plant size scaling factor for the given plant for translating from the design plot display without the depth of field to the simulation plot display with the depth of field;
        (d6) applying the plant size scaling factor to the plant size of the given plant to obtain a final plant size for the given plant; and
        (d7) applying the placement scaling factors to the new coordinates of a given plant to obtain final coordinates of the given plant on the second set of axes of the simulation plot; and
    (e) for each selected plant, displaying in the simulation plot, by the computing processor, the adjusted images at the adjusted placements for each time period in the simulation.

2. The method of claim 1, wherein the receiving (a) comprises:
    (a1) determining that a given plant is selected by a user and placed within the design plot;
    (a2) determining the placement of the given plant within the design plot;
    (a3) retrieving a plurality of images of the given plant from a database comprising information for a plurality of plants; and
    (a4) storing the plurality of images and the placement of the given plant prior to running the simulation.

3. The method of claim 2, wherein the determining (a1) comprises:
    (a1i) receiving one or more search filter attributes for characteristics of the plurality of plants, comprising one or more of the following: category; subcategory; color; light; height; zone; and blooming period;
    (a1ii) applying the one or more search filter attributes to the database; and
    (a1iii) displaying information for one or more plants in the database that satisfy the one or more search filters.

4. The method of claim 1, further comprising:
    (f) receiving an upload of a plurality of images of a given plant; and
    (g) receiving a configuration of an image timeline for the given plant, comprising the uploaded plurality of images of the given plant, wherein during the simulation, the plurality of images of the given plant are displayed as configured in the image timeline.

5. A computer program product comprising a non-transitory computer readable medium having a computer readable program, wherein the computer readable program when executed on a computer causes the computer to:
    (a) receive a selection of one or more plants and a placement of the selected plants in a design plot for the garden, the design plot displaying the garden without a depth of field;
    (b) store a plurality of images and the placement of each selected plant;
    (c) receive a command to run a simulation of the garden, the simulation comprising a plurality of time periods;
    (d) in response to the command, adjusting, by the computing processor, a size and the placement of the plurality of images of each selected plant by translating the design plot display of the garden without the depth of field to the simulation plot display of the garden with a depth of field, the translating comprising:
        (d1) determine design plot dimensions and simulation plot dimensions;
        (d2) determine coordinates of the given plant on a first set of axes of the design plot and a plant size of the given plant;
        (d3) determine coordinate adjustment factors for translating from the design plot display without the depth of field to the simulation plot display with the depth of field;
        (d4) apply the coordinate adjustment factors to the coordinates of the given plant to obtain new coordinates of the given plant on a second set of axes of the simulation plot;
        (d5) determine a placement scaling factor and a plant size scaling factor for the given plant for translating from the design plot display without the depth of field to the simulation plot display with the depth of field;

(d6) apply the plant size scaling factor to the plant size of the given plant to obtain a final plant size for the given plant; and (d7) applying the placement scaling factors to the new coordinates of a given plant to obtain final coordinates of the given plant on the second set of axes of the simulation plot; and (e) for each selected plant, display in the simulation plot the adjusted images at the adjusted placements for each time period in the simulation.

6. The computer program product of claim 5, wherein the receive (a) comprises:

(a1) determine that a given plant is selected by a user and placed within the design plot;

(a2) determine the placement of the given plant within the design plot;

(a3) retrieve a plurality of images of the given plant from a database comprising information for a plurality of plants; and (a4) store the plurality of images and the placement of the given plant prior to running the simulation.

7. The computer program product of claim 6, wherein the determine (a1) comprises:

(a1i) receive one or more search filter attributes for characteristics of the plurality of plants, comprising one or more of the following: category; subcategory; color; light; height; zone; and blooming period;

(a1ii) apply the one or more search filter attributes to the database; and (a1iii) display information for one or more plants in the database that satisfy the one or more search filters.

8. The computer program product of claim 5, further comprising:

(f) receive an upload of a plurality of images of a given plant; and (g) receive a configuration of an image timeline for the given plant, comprising the uploaded plurality of images of the given plant, wherein during the simulation, the plurality of images of the given plant are displayed as configured in the image timeline.

9. A system, comprising:

a server for:

receiving a selection of one or more plants and a placement of the selected plants in a design plot for the garden, the design plot displaying the garden without a depth of field, wherein a plurality of images and the placement of each selected plant is stored;

receiving a command to run a simulation of the garden, the simulation comprising a plurality of time periods;

in response to the command, adjusting, by the computing processor, a size and the placement of the plurality of images of each selected plant by translating the design plot display of the garden without the depth of field to the simulation plot display of the garden with a depth of field, the translating comprising:

determining design plot dimensions and simulation plot dimensions;

determining coordinates of the given plant on a first set of axes of the design plot and a plant size of the given plant;

determining coordinate adjustment factors for translating from the design plot display without the depth of field to the simulation plot display with the depth of field;

applying the coordinate adjustment factors to the coordinates of the given plant to obtain new coordinates of the given plant on a second set of axes of the simulation plot;

determining a placement scaling factor and a plant size scaling factor for the given plant for translating from the design plot display without the depth of field to the simulation plot display with the depth of field;

applying the plant size scaling factor to the plant size of the given plant to obtain a final plant size for the given plant; and applying the placement scaling factors to the new coordinates of a given plant to obtain final coordinates of the given plant on the second set of axes of the simulation plot; and for each selected plant, displaying in the simulation plot the adjusted images at the adjusted placements for each time period in the simulation.

10. The system of claim 9, wherein the receiving of the selection of the one or more plants and the placement of the selected plants in the design plot for the garden comprises:

determining that a given plant is selected by a user and placed within the design plot;

determining the placement of the given plant within the design plot;

retrieving a plurality of images of the given plant from a database comprising information for a plurality of plants; and storing the plurality of images and the placement of the given plant prior to running the simulation.

11. The system of claim 10, wherein the determining that the given plant is selected by the user and placed within the design plot comprises:

receiving one or more search filter attributes for characteristics of the plurality of plants, comprising one or more of the following: category; subcategory; color; light; height; zone; and blooming period;

applying the one or more search filter attributes to the database; and displaying information for one or more plants in the database that satisfy the one or more search filters.

12. The system of claim 9, wherein the server is further for:

receiving an upload of a plurality of images of a given plant; and receiving a configuration of an image timeline for the given plant, comprising the uploaded plurality of images of the given plant, wherein during the simulation, the plurality of images of the given plant are displayed as configured in the image timeline.

\* \* \* \* \*